United States Patent [19]

Jacob

[11] 4,161,685
[45] Jul. 17, 1979

[54] SOLID STATE PROXIMITY SWITCH

[75] Inventor: Keith Jacob, Ann Arbor, Mich.

[73] Assignee: Ibec Industries, Inc., New York, N.Y.

[21] Appl. No.: 857,584

[22] Filed: Dec. 5, 1977

[51] Int. Cl.² .................. H01H 35/38; G05D 7/06
[52] U.S. Cl. ................. 323/19; 200/81.9 M; 323/39; 335/205; 335/207; 361/180
[58] Field of Search .............. 200/81.9 M, 82 E; 307/39, 116; 323/19, 22 SC, 24, 39; 328/5; 324/28 RS; 335/151, 153, 154, 205, 207, 234, 281; 340/547, 551, 609, 611; 361/178–180

[56] References Cited

U.S. PATENT DOCUMENTS

| | | | |
|---|---|---|---|
| 3,305,805 | 2/1967 | Tann | 335/153 |
| 3,363,073 | 1/1968 | Bouguet | 200/81.9 M |
| 3,368,140 | 2/1968 | Tobey | 323/25 X |
| 3,504,235 | 3/1970 | Lee | 323/39 UX |
| 3,560,846 | 2/1971 | Bessko | 335/153 |
| 3,629,678 | 12/1971 | Tyler | 361/179 X |
| 3,919,629 | 11/1975 | Scruggs | 324/41 |
| 3,967,224 | 6/1976 | Seeley | 335/151 |
| 4,038,926 | 8/1977 | Holberry | 335/207 X |

OTHER PUBLICATIONS

GE SCR Manual, 3rd Edition, 1964, pp. 38, 257, 258.
Burdick et al., "Reed Switch Contact Block", IBMTDB, vol. 9, No. 5, Oct. 1966, p. 512.
Conley et al., "Magnetic Object Sensor", IBMTDB, vol. 5, No. 8, Jan. 1963, pp. 44, 45.
Publication J. R. Tepco Inc., "Self Contained Proximity Switches", 300 Series Ferrous Metal AC Proximity Switches, (date not known).

Primary Examiner—A. D. Pellinen
Attorney, Agent, or Firm—Price, Heneveld, Huizenga & Cooper

[57] ABSTRACT

A magnetic proximity sensing apparatus for sensing ferro-magnetic objects is especially well adapted for use with fluid cylinders having pistons formed from magnetically attracted material. The apparatus includes a magnetic actuator responsive to the proximity of the fluid cylinder piston or other ferro-magnetic object which closes a switch and enables electrical circuitry for controlling fluid valves or other apparatus. A reed switch mounted within a hollow, cylindrical, permanent magnet has a separate pole piece secured at one end of the reed switch. The proximity of a ferro-magnetic object changes the flux within the magnet, closing the reed switch. The circuitry is solid state and includes a silicon controlled rectifier acting as a gated switch for completing the circuit.

13 Claims, 4 Drawing Figures

U.S. Patent     Jul. 17, 1979     4,161,685
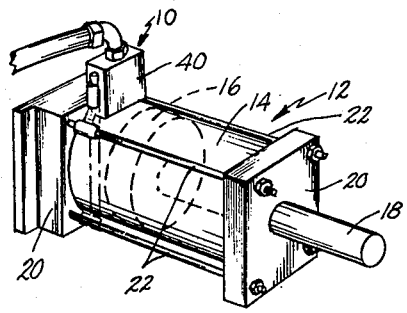
FIG. 1.
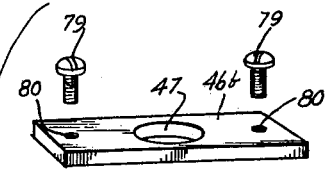
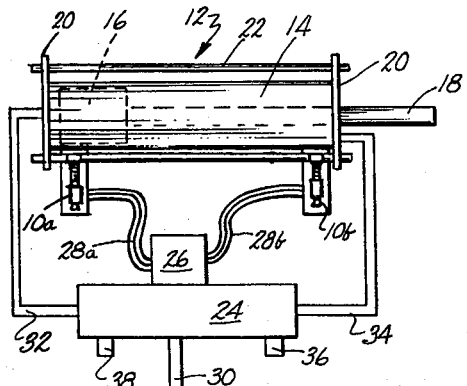
FIG. 2.
FIG. 3.
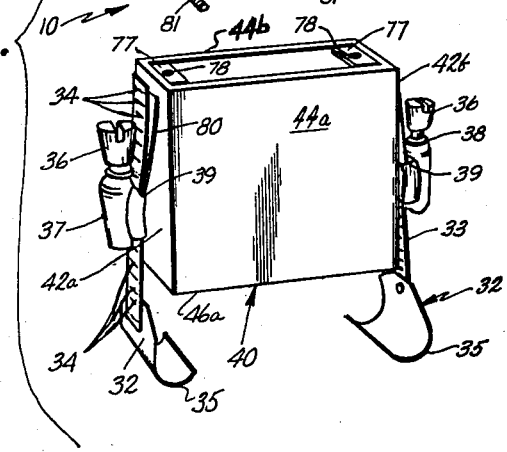
FIG. 4.

SOLID STATE PROXIMITY SWITCH

BACKGROUND OF THE INVENTION

(1) Field of the Invention

This invention relates to proximity sensing apparatus; and, more particularly, to a magnetic proximity sensing device especially adapted for sensing ferrous metal such as the location of a ferrous piston in a fluid motive power cylinder, counting ferrous metal parts, or the proximity of some other ferrous metal member.

(2) Prior Art

It is well known to control various apparatus by sensing the operation of fluid motive power cylinders of either the pneumatic or hydraulic type. By sensing the presence or position of the movable piston within the cylinder, one can control the operation of other apparatus in response to movement of that piston or, alternately, control the length of the stroke of the fluid cylinder piston itself.

Although many types of proximity sensors have been previously devised, many require the presence of magnetic bodies within the part whose movement or proximity is being sensed in order to properly operate the proximity sensor. This is a particular problem with fluid motive power cylinders, a great many of which are manufactured without magnets in their piston bodies. Another problem often encountered is providing a sensor which can be relatively easily manufactured at a relatively low cost, yet continue to provide reliable indication of proximity under extended usage. In particular, sensors with mechanically linked parts tend to be susceptible to wear during extended use and to malfunction due to rough handling.

Known proximity sensors include applying the oscillations of an inductance and capacitance bridge network to a switching network. That is, the introduction of a ferrous material in proximity to a coil, providing the inductance, changes the oscillations in the inductance and capacitance bridge. The switching network includes a silicon controlled rectifier in combination with a diode bridge network. Such a proximity sensor is relatively complex and requires a relatively sensitive balancing of the inductance and capacitance bridge. Further, the switching network has two stages so that the signal from the inductance capacitance bridge is sufficiently amplified to cause switching between a power source and a load. Such a requirement of two stages also adds undesirable complexing and cost to a sensor.

Still another problem typically encountered in the use of proximity sensors with fluid cylinders is the attachment of the sensor to the body of the cylinder. For proper operation it is necessary that the sensing apparatus be secured as closely as possible to the cylinder itself. Prior known structures have included complicated, rigid structures fitting around the body of the cylinder which hold the sensor tightly against the cylinder body. Relatively rigid structures have also been used to attach the sensing apparatus to cylinder tie rods. However, since adjustment of the position of the sensors is often necessary when the piston stroke must be adjusted, such prior structures have often been difficult to move or adjust. Other structures have fixedly mounted the sensing apparatus at the ends of the cylinder eliminating flexibility necessary for complete utilization of the sensing apparatus.

In addition, it is desirable from a manufacturing standpoint to have a proximity sensing apparatus which is adaptable to many uses such as for counting metal parts, sensing the location of moving metal parts on rams or presses, or the like.

The present invention overcomes the above problems by providing a sensing apparatus which substantially eliminates the use of moving mechanical parts and is easily and securely attached to the existing structure of fluid cylinders and other apparatus without the necessity of providing additional complicated, rigid structure and without the necessity of disassembling any portion of the fluid cylinder. The present invention is self contained and does not require the addition or inclusion of magnets on any part of the body being sensed. Thus, the invention is especially useful with pre-existing fluid cylinders which do not include magnets in their piston bodies. Also, the invention can be effectively used in many applications such as sensing metal parts to count or locate the same, during inspection, serving as a limit switch or trigger for another event or various machinery, or providing a sensor in a visible or audible signaling system.

SUMMARY OF THE INVENTION

Accordingly, the present invention provides a magnetic proximity sensing apparatus which can be especially adapted for use with fluid and motive power cylinders of either the pneumatic or the hydraulic variety. The apparatus includes a gated electronic switch responsive to actuation by a magnetic sensing device. Generally, the circuit is characterized by being relatively inexpensively manufactured of standard components which are particularly well suited for reliable use during extensive operation. The apparatus can also include a clamping structure which allows easy adjustment of the position of the proximity senosr and yet locates the sensor such that it is adjacent to a side of the fluid cylinder.

More specifically, the apparatus includes a gated switch means for completing an electrical circuit coupling an electrical source to an electrical load responsive to the position of the piston. A magnetic actuator means for selectively conditioning the gated switch means between a conductive condition and a non-conductive condition is coupled to the gate of the gated switch means. The magnetic actuator means is positioned closely adjacent to the fluid cylinder so that the presence of the piston adjacent the actuator means completes a gate electrical circuit to the gate of the switch means and couples an electrical signal to the gate making the gated switch means conductive.

In one embodiment of this invention, the magnetic actuator means is a reed switch adjacent a permanent magnet. When the piston is positioned adjacent the reed switch, the magnetic flux of the magnet is changed causing two reeds within a glass envelope to touch. Thus, the mechanical motion necessary to close a switch is very small and is particularly well suited for rugged and reliable use.

Advantageously, with the exception of the magnetic reed switch, the invention uses solid state circuit components for small size and rugged construction. The circuit components can be encased in an epoxy thereby adding to the ruggedness of the apparatus. If desired, the apparatus can be easily and simply replaced on the cylinder. This invention is particularly advantageous in comparison to some known prior art because of the simplicity of the reed switch and magnet combination and the relatively direct coupling of the reed switch to the switching between the load and the power source thus eliminating the need for two stages of amplification.

BRIEF DESCRIPTION OF THE DRAWINGS

FIG. 1 is a perspective view of a typical fluid cylinder demonstrating the magnetic proximity sensing apparatus of the present invention secured to a tie rod of the cylinder;

FIG. 2 is an exploded perspective view of a magnetic proximity sensing device in accordance with an embodiment of this invention;

FIG. 3 is a schematic illustration of a pair of the magnetic proximity sensing devices of the present invention secured to a typical fluid motive power cylinder and connected to control the operation of the cylinder via a solenoid operated fluid valve; and FIG. 4 is a schematic representation and diagram of the circuit of a magnetic proximity sensing device in accordance with an embodiment of this invention.

DESCRIPTION OF THE PREFERRED EMBODIMENT

Referring now to the drawings in greater detail, FIGS. 1 and 3 illustrate the magnetic proximity sensing apparatus 10 of the present invention secured to a fluid motive power cylinder 12 of the pneumatic type. Fluid cylinder 12 includes a right circular cylinder housing 14 preferably formed from a nonmagnetic material such as aluminum or brass including a piston 16 mounted for reciprocal movement therein. Piston 16 is secured to the end of push or connecting rod 18 which extends outwardly of at least one end of the cylinder for movement of an apparatus to be powered by the cylinder. The ends of housings 14 are closed by closure plates 20 which seal the ends of the cylinder to form a fluid tight housing. Closures 20 are securely held in place by a plurality of tie rods 22, in this case four, which are spaced equally about the circumference of the cylinder and hold the end closures securely against the ends of housing 14. Typically, piston 16 is formed from a ferro-magnetic material such as hardened steel or the like such that it will be magnetically attractable and attract magnets toward it.

As best seen in FIG. 3, operation of the pneumatic fluid cylinder 12 is typically controlled by means of a spool valve 24 or the like. Spool valve 24 in turn is typically operated by an electric solenoid operated pilot valve 26 cooperatingly associated with the spool valve 24. A pair of the magnetic sensing apparatus 10a and 10b are secured at spaced locations between two of the tie rods 22 supporting the cylinder 12 such that they lie generally tangentially along the side or sides of cylinder housing 14 against or in close proximity thereto. Sensors 10a and 10b are connected by electrical wires 28a and 28b to the pilot valve 26 to control insertion and exhaustion of fluid, in this case compressed air, opposite sides of piston 16 for movement thereof.

For example, compressed air inserted through a supply line 30 to spool valve 24 is directed by appropriate conventional valving within the spool valve to fluid conduit 32. Conduit 32 inserts the fluid at the left end of the cylinder against piston 16 (FIG. 3). Simultaneously, fluid conduit 34 on the opposite side of piston 16 is opened via the valving in spool valve 24 to exhaust outlet 36. Pressure against the left end of piston 16 moves the piston to the right in FIG. 1 until it comes within the influence of the magnetic field of the magnet within sensor 10b at the right end of the cylinder. Sensor 10b senses the position of the piston head, closes an electric switch, signals pilot valve 26 by an electrical wiring 28b which closes fluid conduit 34 to halt the rightward movement of the piston head. In a similar manner, when piston 16 is moved to the left by compressed air inserted there against through fluid conduit 34, sensor 10a will sense the presence of piston head 16, signal the valving, stopping the exhaust of air from the opposite side of the piston through exhaust outlet 38, and halt the leftward movement of the piston. Thus, location of sensors 10a and 10b controls the length of stroke of piston 16 within cylinder housing 14.

As shown in FIGS. 1 and 2, magnetic proximity sensing apparatus 10 includes a generally rectangular housing 40 including generally planar sidewalls 42a, 42b, generally planar front and back walls 44a, 44b, a closed bottom end wall 46a, and a top end wall 46b having an opening 47 therethrough for insertion of electrical wiring. One or more of the sides, top, bottom, or end panels is removably secured by appropriate screws or the like to the other panels for access to the internal mechanism of the sensor. The housing 40 provides a cover to protect the internal mechanism from dust, dirt, and undesired tampering with the mechanism.

FIG. 2 is an exploded view which shows a printed circuit board 75 upon which are mounted the electrical components of sensing apparatus 10. Output terminals 65 and 66 extend from one side of circuit board 75 and electrically connect sensing apparatus 10 to electrical wires which would extend through opening 47. A pair of flanges 77 extend inwardly from the top portions of sidewalls 42a and 42b and each have an opening 78 for receiving a screw 79 extending through an opening 80 in end wall 46b. Printed circuit board 75 is positioned within housing 40 and aligned by three spacing posts 81 which extend generally perpendicularly outward from a major surface of circuit board 75 and are secured thereto. After printed circuit board 75 is within housing 40, an epoxy material can be used to encase printed circuit board 75 and fill housing 40 leaving terminals 65 and 66 exposed. The epoxy protects and seals the printed circuit board 75 against the environment and absorbs shocks.

In order to properly secure proximity sensing apparatus 10 generally tangentially against the side of cylinder housing 14 (FIGS. 1 and 3), a clamping arm 32 extends from each of two opposing sides of housing 40. Clamping arm 32 includes an elongated strap 33 having a plurality of trasverse openings or slots 34 spaced longitudinally along the length of strap 33. A mount 37 supports a screw 36 and receives strap 33 so that the threads of screw 36 engage the openings or slots 34 of strap 33 thereby longitudinally moving strap 33 when screw 36 is turned. Mount 37 is coupled to the side of housing 40 and contains a threaded receiving opening 38 for receiving screw 36 and an elongated opening 39 for receiving strap 33 (FIG. 2). Coupled to the bottom extremity of strap 33, away from housing 40, is a hook or clamp member 35 curved to receive and retain a tie rod 22. The coupling between clamp 35 and strap 33 can be such means as a rivet. Strap 33 can be sufficiently long so that it can couple to the tie rods 22 on the same side of cylinder 12 as housing 40 (shown in solid lines in FIG. 1) or on the other side of cylinder 12 from housing 40 (shown in phantom in FIG. 1). Clamping arm 32 allows sensing apparatus 10 to be secured as described without disassembly by simply loosening screws 36, positioning clamps 35 around tie rods 22 and thereafter tightening screws 36. The position of the sensing apparatus 10 may be adjusted along the length of the cylinder 12 merely by loosening screws 36, sliding the apparatus to the desired positioning, and retightening screws 36. Although two clamping arms, one on either side of housing 40, are preferred, sensor 10 can be clamped to the fluid cylinder or another device by only one clamping arm if strap 33 or 34 is sufficiently rigid. Clamping arm 32 forms no part of the this invention and is more specifically described and claimed in a copending application Ser. No. 857,790, invented by Charles W. Ward and entitled CLAMPING APPARATUS.

Referring to FIG. 4, there is shown the circuitry which completes an electric circuit 100 between a load 50 and an AC source 51. Completing a conduction path through circuit 100 is initiated by a reed switch 52 which includes internal contacts 53 and 54 within a glass envelope 55. A cylindrical magnet 56 has a longitudinal central opening for receiving glass envelope 55. A pole piece 57 is positioned adjacent one end of the opening within magnet 56 to concentrate the lines of flux of magnet 56 when a ferrous piston head comes into proximity of reed switch 52. A silicon controlled rectifier 58 acts as a switch responsive to reed switch 52 and has an input coupled through a resistor 59 to contact 53 and an output coupled to contact 54 through capacitor 60. The gate terminal of silicon controlled rectifier 58 is coupled to the output terminal of silicon controlled rectifier 58 by a resistor 61. Resistor 61 acts to provide a voltage between the gate and output terminals of rectifier 58 thereby providing a biasing voltage to switch rectifier 58 between a conducting and a nonconducting condition. The gate terminal of silicon controlled rectifier 58 is coupled to contact 54 through a filter diode 62.

The series combination of a resistor 63 and a capacitor 64 is coupled between the input and the output terminals of silicon controlled rectifier 58 to reduce the switching sensitivity of rectifier 58 to transient signals. Resistor 63 and capacitor 64 limit the rate of rise of voltage across silicon controlled rectifier 58 so that rectifier 58 is not falsely triggerd. That is, an intermittent or transient closing of contacts 53 and 54 has a delayed and reduced effect because of resistor 63 and capacitor 64. Circit 100 has output terminals 65 and 66 to which are coupled the series combination of load 50 and source 51. Across terminals 65 and 66 is coupled a metal oxide varistor 67 to protect against AC source transients and designed to conduct at a predetermined voltage. For example, varistor 67 can conduct at about 184 volts peak. Varistor 67 is desirable since silicone controlled rectifier 58 is susceptible to damage when exposed to unusually high peak voltages.

A bridge rectifier including diodes 68, 69, 70 and 71 is connected in a series closed loop with four nodes so that silicon controlled rectifier 58 is across two opposing nodes and load 50 is coupled across the remaining two opposing nodes. More specifically, diode 68 is coupled between output terminal 65 and the input of silicon controlled rectifier 58. Diode 69 is coupled between output terminal 66 and the input of silicon controlled rectifier 58. Diode 70 is coupled between the output of node of silicon controlled rectifier 58 and output terminal 65. Diode 71 is coupled between the output node of silicon controlled rectifier 58 and output terminal 66.

The bridge rectifier in combination with silicon controlled rectifier 58 acts as an AC switch rather than a switch for current flowing in just one direction. That is, regardless of the cycle of AC source 51, the bridge rectifier supplies current to silicon controlled rectifier 58 and rectifier 58 will conduct whenever an appropriate signal is present at the gate terminal of rectifier 58.

Diodes 62 and capacitor 60 together a contact bounce filter for reed switch 52 to eliminate transients due to electrical discontinuities between contact 53 and 54 caused by the bouncing of one contact against the other. That is, as current starts to flow through reed switch 52, capacitor 60 begins to charge and current flows through resistor 61 to develop a biasing voltage. If a temporary opening of contacts 53 and 54 takes place, capacitor 60 tends to discharge through resistor 61 thereby continuing to maintain a biasing voltage keeping rectifier 58 conductive. Of course, if contacts 53 and 54 remain open a longer time, indicating that the cylinder piston is no longer adjacent reed switch 52, capacitor 60 discharges, the biasing voltage across resistor 61 is reduced, and silicon controlled rectifier becomes nonconductive.

Resistor 59 limits the amount of current flowing through reed switch 52 by adjusting the resistance of two parallel paths, one including reed switch 52 and the other including rectifier 58. Nevertheless, resistor 59 is of such a value that sufficient current flows through reed switch 52 to provide a voltage biasing signal across resistor 61 to make conductive rectifier 58.

In operation, proximity of piston 16 to reed switch 52 causes an increase in magnetic flux in the air gap within permanent magnet 56. That is, there is increased magnetic flux through contacts 53 and 54 which are made of a material capable of being magnetized so that contacts 53 and 54 attract each other and close. Electrical connection between contacts 53 and 54 completes the circuit between the output junction of diodes 68 and 69 and the input junction of diodes 70 and 71. Current flows through resistor 59, reed switch 52, diode 62 and resistor 61. The voltage developed across resistor 61 is sufficient to turn on rectifier 58. When rectifier 58 turns on, a relatively low resistance path is completed coupling load 50 and a source 51. The time constant of the path including resistor 63 and capacitor 64, parallel to rectifier 58, is sufficiently short that it presents essentially an open circuit during each cycle of the alternating current of source 61.

While one form of the invention has been shown and described, other forms will now be apparent to those skilled in the art. Therefore, it will be understood that the embodiment shown in the drawings and described above is merely for illustrative purposes and is not intended to limit the scope of the invention which is defined by the claims which follows.

The embodiments of the invention in which an exclusive property or privilege is claimed are defined as follows.

1. A magnetic proximity apparatus comprising:
   a base means for supporting said apparatus;
   a gated switch means for selectively completing an electrical circuit coupling an electrical source to an electrical load responsive to the position of a ferromagnetic object, said gated switch means having a control gate for receiving a signal causing said switch means to complete the electrical circuit;
   an elongated magnetic actuator means for selectively conditioning said gated switch means between a conductive and nonconductive condition, said actuator means being electrically coupled to said control gate of said gated switch means such that the presence of a ferro-magnetic object axially adjacent an end of said actuator means causes said actuator means to apply an electrical signal to said control gate making said gated switch means conductive; and said magnetic actuator means comprising a hollow cylindrical permanent magnet and a reed switch positioned within said permanent magnet and wherein the length of said cylindrical permanent magnet is greater than the length of said reed switch so as to enclose said reed switch within said permanent magnet whereby increasing the proximity of a ferro-magnetic object to an end of said permanent magnet and said reed switch increases the magnetic flux from said permanent magnet through said reed switch sufficiently to close said reed switch.

2. A magnetic proximity apparatus as recited in claim 1 and further including a pole piece of a ferrous material, said pole piece positioned adjacent an end of said cylinder to concentrate the lines of magnetic flux acting on said reed switch.

3. A magnetic proximity apparatus as recited in claim 2 wherein said gated switch means includes a silicon controlled rectifier having an input terminal, an output terminal and a gate terminal, said reed switch being coupled between said gate terminal and said input terminal.

4. A magnetic proximity switch as recited in claim 3 further comprising a biasing means for establishing a voltage differential between said gate terminal and said output terminal when said reed switch is conductive thereby making conductive said silicon controlled rectifier.

5. A magnetic proximity switch as recited in claim 4 wherein said biasing means is a resistor coupled between said output terminal and said gate terminal.

6. A magnetic proximity as recited in claim 3 further comprising filter means coupled between said reed switch and said silicon controlled rectifier for reducing variation of the voltage at the gate terminal resulting from intermittent electrical conduction of said reed switch due to contact bounce.

7. A magnetic proximity switch as recited in claim 6 wherein said filter means includes a filter diode coupled between said gate terminal and said reed switch and a first capacitor coupled between said output terminal and said reed switch.

8. A magnetic proximity switch as recited in claim 6 further comprising a series resistor and capacitor combination coupled across the input and output terminals of said silicon controlled rectifier for limiting the rise of voltage across said silicon controlled rectifier so that transient magnetic influences causing a transient conductivity of said reed switch have a reduced effect.

9. A magnetic proximity switch as recited in claim 6 further comprising a load resistor coupled between said reed switch and said input terminal for controlling the amount of current flow through said reed swtich when it is closed in a conductive state.

10. A magnetic proximity apparatus as recited in claim 6 further comprising:

a four diode bridge rectifier wherein a first series combination of a first and a second diode are coupled in parallel with a second series combination of a third and a fourth diode; and wherein said switch means is coupled in parallel with said first series combination thereby completing an electrical path through said bridge rectifier from a first node between said first and second diodes to a second node between said third and fourth diodes whenever said switch means is conductive.

11. A magnetic proximity switch as recited in claim 10 further comprising an input limiting means coupled between said first and second nodes for limiting voltage transients applied between said first and second nodes by conducting and providing a decreased resistance path for applied voltages greater than a predetermined voltage level.

12. A magnetic proximity switch as recited in claim 11 wherein said input limiting means includes a metal oxide varistor.

13. A magnetic proximity apparatus comprising:

an elongated magnetic actuator means for selectively conditioning an electric circuit between a conductive and nonconductive condition, said actuator means being electrically coupled to the electric circuit so that the presence of a ferro-magnetic object axially adjacent an end of said actuator means causes said actuator means to apply an electrical signal to the electric circuit and cause said conductive condition, said magnetic actuator means including a cylindrical permanent magnet and a reed switch positioned within said permanent magnet wherein the length of said cylindrical permanent magnet is greater than the length of said reed switch to enclose said reed switch within said permanent magnet whereby increasing the proximity of a ferro-magnetic object to one end of said cylindrical permanent magnet increases the magnetic flux from said reed switch and the magnetic flux increases sufficiently to close said reed switch, said actuator further including a pole piece of a ferrous material, said pole piece positioned adjacent to said one end of said cylindrical permanent magnet to concentrate the lines of magnetic flux acting on said reed switch.

* * * * *

UNITED STATES PATENT AND TRADEMARK OFFICE
CERTIFICATE OF CORRECTION

PATENT NO. : 4,161,685
DATED     : July 17, 1979
INVENTOR(S) : Keith Jacob

It is certified that error appears in the above-identified patent and that said Letters Patent are hereby corrected as shown below:

Column 2, line 37:
   "senosr" should be --sensor--

Column 4, line 52:
   "trasverse" should be --transverse--

Column 5, line 48:
   "Circit" should be --Circuit--

Column 6, line 8:
   after "together" insert --form--

Column 7, Claim 6, line 41
   after "proximity" insert --switch--

Signed and Sealed this

Nineteenth Day of February 1980

[SEAL]

Attest:

SIDNEY A. DIAMOND

Attesting Officer

Commissioner of Patents and Trademarks